US012809810B2

(12) United States Patent
Rakhra et al.

(10) Patent No.: US 12,809,810 B2
(45) Date of Patent: Nov. 24, 2026

(54) SYSTEM AND METHOD FOR DIGITAL COMMUNICATIONS

(71) Applicant: Raytheon Systems Limited, Harlow (GB)

(72) Inventors: Puran Rakhra, Glenrothes (GB); David L. Gordon, Glenrothes (GB)

(73) Assignee: Raytheon Systems Limited, Harlow (GB)

( * ) Notice: Subject to any disclaimer, the term of this patent is extended or adjusted under 35 U.S.C. 154(b) by 44 days.

(21) Appl. No.: 18/976,557

(22) Filed: Dec. 11, 2024

(65) Prior Publication Data

US 2025/0190393 A1 Jun. 12, 2025

(30) Foreign Application Priority Data

Dec. 12, 2023 (GB) ..................................... 2318951

(51) Int. Cl.

| | |
|---|---|
| ***G06F 13/42*** | (2006.01) |
| ***G06F 1/12*** | (2006.01) |
| ***G06F 11/30*** | (2006.01) |
| ***H03K 5/00*** | (2006.01) |
| ***H03K 5/01*** | (2006.01) |

(52) U.S. Cl.

CPC ........... *G06F 13/4282* (2013.01); *H03K 5/01* (2013.01); *G06F 2213/0012* (2013.01); *H03K 2005/00058* (2013.01)

(58) Field of Classification Search

CPC ......... G06F 13/122; G06F 13/387; H03L 7/06

See application file for complete search history.

(56) References Cited

U.S. PATENT DOCUMENTS

| | | | | |
|---|---|---|---|---|
| 11,341,081 | B1 * | 5/2022 | Mogensen | G06F 13/122 |
| 2002/0191723 | A1 * | 12/2002 | Fujita | H03L 7/06 375/376 |
| 2020/0076439 | A1 | 3/2020 | Weeks et al. | |
| 2020/0104270 | A1 * | 4/2020 | Poezart | G06F 13/387 |
| 2023/0308104 | A1 | 9/2023 | Nelson | |
| 2024/0152480 | A1 * | 5/2024 | Wang | G06F 13/4282 |

(Continued)

OTHER PUBLICATIONS

Texas Instruments, "Dual Digital Isolator", ISO7221C-HT, Apr. 2011, 19 pages.

(Continued)

*Primary Examiner* — Getente A Yimer

(57) ABSTRACT

A digital communication system includes a processing device, a remote device, a signal path including one or more components and providing a communicative connection between the processing device and the remote device, and at least one temperature sensor arranged to sense a temperature and send a sensed temperature value to the processing device. The processing device is arranged to generate a clock signal and send the clock signal through the signal path to the remote device. The remote device is arranged to generate a digital data signal with a timing based on the received clock signal and send the digital data signal through the signal path to the processing device. The processing device is further arranged to derive a delay value from the sensed temperature value, obtain a variable clock signal having a variable delay relative to the clock signal, and use the variable clock signal to sample the received digital data signal.

20 Claims, 2 Drawing Sheets

(56) References Cited

U.S. PATENT DOCUMENTS

| | | | | |
|---|---|---|---|---|
| 2024/0364321 | A1* | 10/2024 | Chen | G06F 13/4291 |
| 2025/0035419 | A1* | 1/2025 | Jones | F42C 15/40 |
| 2025/0231342 | A1* | 7/2025 | Ryan | G02B 6/12002 |

OTHER PUBLICATIONS

Texas Instruments, "SPI Master With Signal Path Delay Compensation on PRU-ICSS", Jul. 2015, 29 pages.

Combined Search and Examination Report in connection with counterpart GB Patent Application No. 2318951.7 dated May 31, 2024, 6 pages.

* cited by examiner

SYSTEM AND METHOD FOR DIGITAL COMMUNICATIONS

CROSS-REFERENCE TO RELATED APPLICATION AND PRIORITY CLAIM

This application claims priority under 35 U.S.C. § 119 to United Kingdom Patent Application No. 2318951.7 filed on Dec. 12, 2023, which is hereby incorporated by reference in its entirety.

TECHNICAL FIELD OF THE INVENTION

The present application relates to a system and method for digital communications, and in particular to a system and method for synchronous serial communications, such as SPI.

BACKGROUND TO THE INVENTION

It is common in digital communications such as synchronous serial communications for a processing device to send a digital command signal and clock signal to a remote data source, such as a sensor or analog to digital converter (ADC), and for the remote data source to generate a data signal with timing based on the received clock signal, and return the data signal to the processing device. The processing device then uses the same clock signal to sample, latch or acquire the received data signal. Digital communications of this type are commonly used, with one well known example being Serial Peripheral Interface (SPI) approaches.

In many applications of digital communications of this type it is desirable to use a high clock frequency. This may, for example, be desirable in order to provide improved fidelity and accuracy, for example where the remote data source is a sensor or ADC, or to enable a higher data transfer rate between the processing device and the remote data source. However, in practice it has been found that the data received at the processing device may become corrupted due to excessive propagation delay if too high a clock signal frequency is used.

The inventors have devised the claimed invention in light of the above considerations. The embodiments described below are not limited to implementations which solve any or all of the disadvantages of the known approaches described above.

SUMMARY OF INVENTION

This Summary is provided to introduce a selection of concepts in a simplified form that are further described below in the Detailed Description. This Summary is not intended to identify key features or essential features of the claimed subject matter; variants and alternative features which facilitate the working of the invention and/or serve to achieve a substantially similar technical effect should be considered as falling into the scope of the invention.

The invention is defined as set out in the appended set of claims.

In a first aspect of the present invention, there is provided a digital communication system comprising: a processing device; a remote device; a signal path comprising one or more components and providing a communicative connection between the processing device and the remote device; and at least one temperature sensor arranged to sense a temperature and send a sensed temperature value to the processing device; wherein: the processing device is arranged to generate a clock (CLK) signal and send the clock signal through the signal path to the remote device; the remote device is arranged to generate a digital data signal with a timing based on the received clock signal and send the digital data signal through the signal path to the processing device; the processing device is further arranged to derive a delay value from the sensed temperature value, the delay value corresponding to a temperature dependent variation in signal propagation delay along the signal path in both directions, obtain a variable clock signal having a variable delay relative to the clock signal, with the variable delay corresponding to the delay value, and use the variable clock signal to sample the received digital data signal.

This may provide the advantages of reducing or avoiding the problem of data corruption at high clock frequencies due to temperature dependent variation in signal propagation delay. This may enable operation at a higher clock frequency than would otherwise be possible, enabling improved fidelity and accuracy, and/or a higher data transfer rate to be achieved.

In some embodiments, the digital communication system uses a Serial Peripheral Interface (SPI) digital communication protocol. This may be advantageous because the present invention is particularly effective when applied to SPI.

In some embodiments, the digital data signal is a Main In Sub Out (MISO) signal. This may provide advantages in ensuring accurate and reliable operation. In some embodiments, the processing device is further arranged to generate a Chip Select (CS) signal and send the Chip Select signal through the signal path to the remote device. This may provide advantages in ensuring accurate and reliable operation.

In some embodiments, the processing device is further arranged to generate a Main Out Sub In (MOSI) signal and send the Main Out Sub In signal through the signal path to the remote device. This may provide advantages in ensuring accurate and reliable operation.

In some embodiments, the temperature sensor is arranged to sense a temperature of the digital communication system or an ambient temperature around the digital communication system. This may provide advantages in ensuring accurate and reliable operation by having the variable delay match the temperature dependent variation in signal propagation delay more closely.

In some embodiments, the delay value is derived from the sensed temperature value using a look up table. This may provide advantages by enabling quick and efficient derivation of the delay value.

In some embodiments, the look up table is comprised in the processing device. This may provide advantages of compact and space efficient design.

In some embodiments, the variable clock signal is generated by passing the clock signal through a variable delay device. This may provide advantages by enabling reliable and efficient generation of the variable clock signal.

In some embodiments, the variable delay device is comprised in the processing device. This may provide advantages of compact and space efficient design.

In some embodiments, the processing device is a Field Programmable Gate Array (FPGA). This may provide advantages of improved efficiency and reliability.

In some embodiments, the remote device is an analog to digital converter. This may enable operation of the analog to digital converter at a higher clock frequency than would otherwise be possible, enabling the analog to digital converter to provide digital values having improved accuracy.

In a second embodiment of the present invention, there is provided a missile comprising a digital communication system according to the first aspect. This may provide particular advantages in the high range of operating temperatures which may be encountered by a missile of reducing or avoiding the problem of data corruption at high clock frequencies due to temperature dependent variation in signal propagation delay, which may enable operation at a higher clock frequency than would otherwise be possible, enabling improved fidelity and accuracy, and/or a higher data transfer rate to be achieved.

In a third embodiment of the present invention, there is provided a method of digital communication between a processing device and a remote device through a signal path comprising one or more components, the method comprising: the processing device generating a clock (CLK) signal and sending the clock signal through the signal path to the remote device; the processing device receiving a temperature value; the remote device generating a digital data signal with a timing based on the received clock signal and sending the digital data signal through the signal path to the processing device; the processing device deriving a delay value from the received temperature value, the delay value corresponding to a temperature dependent variation in signal propagation delay along the signal path in both directions, obtaining a variable clock signal having a variable delay relative to the clock signal, with the variable delay corresponding to the delay value, and using the variable clock signal to sample the received digital data signal.

This may provide the advantages of reducing or avoiding the problem of data corruption at high clock frequencies due to temperature dependent variation in signal propagation delay. This may enable operation at a higher clock frequency than would otherwise be possible, enabling improved fidelity and accuracy, and/or a higher data transfer rate to be achieved.

In some embodiments, the digital communication uses a Serial Peripheral Interface (SPI) digital communication protocol. This may be advantageous because the present invention is particularly effective when applied to SPI.

In some embodiments, the digital data signal is a Main In Sub Out (MISO) signal. This may provide advantages in ensuring accurate and reliable operation.

In some embodiments, the processing device further generates a Chip Select (CS) signal and sends the Chip Select signal through the signal path to the remote device. This may provide advantages in ensuring accurate and reliable operation.

In some embodiments, the processing device further generates a Main Out Sub In (MOSI) signal and sends the Main Out Sub In signal through the signal path to the remote device. This may provide advantages in ensuring accurate and reliable operation.

In some embodiments, the processing device, the remote device and the signal path are comprised in a digital communication system, and the temperature is a temperature of the digital communication system or an ambient temperature around the digital communication system.

In some embodiments, the delay value is derived from the sensed temperature value using a look up table. This may provide advantages by enabling quick and efficient derivation of the delay value.

In some embodiments, the variable clock signal is generated by passing the clock signal through a variable delay device. This may provide advantages by enabling reliable and efficient generation of the variable clock signal.

The features and embodiments discussed above may be combined as appropriate, as would be apparent to a person skilled in the art, and may be combined with any of the aspects of the invention except where it is expressly provided that such a combination is not possible or the person skilled in the art would understand that such a combination is self-evidently not possible.

BRIEF DESCRIPTION OF THE DRAWINGS

Embodiments of the present invention are described below, by way of example, with reference to the following drawings.

Figure 1:
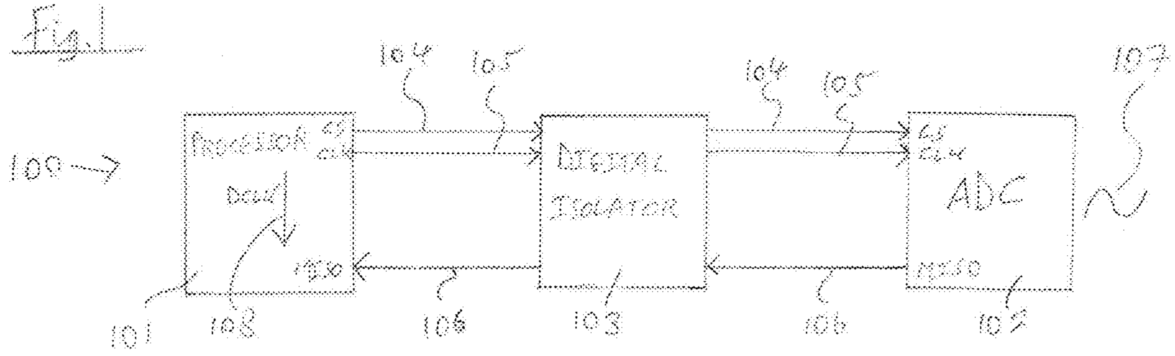
FIG. 1 shows a schematic diagram of an explanatory example of a digital communication system.

Common reference numerals are used throughout the figures to indicate the same or similar features.

DETAILED DESCRIPTION

Embodiments of the present invention are described below by way of example only. These examples represent the best mode of putting the invention into practice that are currently known to the Applicant although they are not the only ways in which this could be achieved. the description sets forth the functions of the example and the sequence of steps for constructing and operating the example. However, the same or equivalent functions and sequences may be accomplished by different examples.

In broad terms, the general concept of the present disclosure is for a processing device connected to a remote device to use a sensed temperature to determine a time delay value corresponding to a temperature dependent variation in signal propagation delay from the processing device to the remote device and back, and to use a variable clock signal with a delay corresponding to the time delay value to sample a digital data signal from the remote device.

FIG. 1 shows a schematic diagram of a digital communication system 100 using a Serial Peripheral Interface (SPI) digital communication protocol, according to an explanatory example. In the illustrated example of FIG. 1 the digital communication system 100 comprises a processing device 101 which is arranged to receive and process digital data from a remote device 102. In the illustrated example the remote device 102 is an analog to digital converter (ADC), and a digital isolator 103 arranged in the communications path between the processing device 101 and the remote device 102. The processing device 101 may be referred to as a main or master device and the remote device 102 may be referred to as a subsidiary or slave device.

The digital isolator 103 provides galvanic isolation between the processing device 101 and the remote device 102. This may protect the processing device 101 from accidental damage in operation.

In operation of the digital communication system 100, the processing device 101 generates a digital Chip Select (CS) signal 104 and a digital Clock (CLK) signal 105 and sends the CS signal 104 and CLK signal 105 to the digital isolator 103. The processing device 101 also generates a delayed CLK (DCLK) signal 108 with a fixed time delay compared to the original CLK signal 105. Typically, the processing device 101 can generate the DCLK signal 108 by passing the CLK signal 105 through a delay device having a fixed delay time, such as a shift register (not shown). The digital isolator

103 receives the CS signal 104 and the CLK signal 105, and then sends them on to the remote device 102. In response to the received CS signal 104, the remote device 102 generates a digital data Main In Sub Out (MISO) signal 106 with a timing based on the received CLK signal 105. Generally, at the remote device 102 the generation of each bit of the MISO signal 106 is triggered by the reception of a predetermined part of the CLK signal 105, such as a rising or falling edge of the CLK signal 105.

In the illustrated example the remote device 102 is an ADC which uses the received CS signal 104 to initiate the analog to digital conversion of an analog signal 107 into digital values, and uses the CLK signal 105 to prompt or trigger the generation of each bit of a current digital value as digital data. The remote device 102 then outputs the generated bits as digital data carried by the MISO signal 106. Accordingly, the timing of the sent bits of the MISO signal 106 is based on the timing of the received CLK signal 105.

The remote device 102 sends the MISO signal 106 to the digital isolator 103. The digital isolator 103 receives the MISO signal 106, and then sends it on to the remote device 102. The processing device 101 then samples or latches (also referred to as capturing) the digital values of the MISO signal 106 using the DCLK signal 108 to obtain the digital data from the remote device 102 with values corresponding to the timing of the CLK signal 105. In the illustrated example, the digital data obtained by the processing device 101 is bit values making up digital values corresponding to the values of the analog signal 107.

It will be understood that in practice the digital isolator 103 will introduce propagation delays in the digital signals passing between the processing device 101 and the remote device 102 through the digital isolator 103, and in particular will introduce a propagation delay in the CLK signal 105 sent from the processing device 101 to the remote device 102 through the digital isolator 103, and in the MISO signal 106 sent from the remote device 102 to the processing device 101 through the digital isolator 103 (usually these propagation delay will be the same, or substantially the same, in each direction), in addition to internal delays within the remote device 102, so that the MISO signal 106 received at the processing device 101 will be delayed in time compared CLK signal 105 which triggered the generation of the MISO signal 106 by a total, or "round trip", propagation delay which is the sum of the propagation delays between the processing device 101 and the remote device 102 in both directions. It is in order to compensate for this propagation delay that the processing device 101 uses the DCLK signal 108 to sample or latch the digital values of the MISO signal 106, rather than the original CLK signal 105, as is discussed above. In any specific implementation of the digital communication system 100, the total propagation delay can be determined from the known properties of the digital isolator 103 and the delay between the CLK signal 105 and the DCLK signal 108 set to a corresponding fixed delay time. Propagation delay can be compensated for in a similar manner if an alternative component is located in the signal path between the processing device 101 and the remote device 102 instead of a digital isolator.

If the propagation delay in the digital communication system 100 were not compensated for by applying a fixed delay to the CLK signal 105, there is a risk that the incoming data obtained from the received MISO signal 106 by the processing device 101 could be corrupted. Generally, the processing device 101 synchronizes the latching or sampling of the incoming data with a rising or falling edge of a clock signal (the CLK signal 105 or the DCLK signal 108). As a result, absent compensation, if the total propagation delay results in the received MISO signal 106 being delayed by around a full clock cycle, or more, of the CLK signal 105 compared to the sending time of the corresponding part (typically a rising or falling edge) of the CLK signal 105 on which the generation of the MISO signal 106 was based, this may lead to the incoming data of the MISO signal 106 being sampled at, or after, the time boundary between the correct CLK signal 105 pulse and the subsequent pulse. As a result, the obtained digital data obtained by the processing device 101 from the MISO signal could be invalid and/or corrupted.

For example, where the digital communication system 100 is an SPI system in which the remote device 102 is arranged to generate new data on a falling edge of the CLK signal 105 and the processing device 101 is arranged to latch or sample received data on the rising edge of the CLK signal 105 without compensation, in order to avoid the risk of corruption the propagation delay must be sufficiently small that each data bit of the MISO signal 106 is received at the processing device 101 before the rising edge of the CLK signal 105 following the falling edge of the CLK signal 105 which triggered generation of that data bit. Accordingly, the use of the DCLK signal 108 to compensate for the anticipated propagation delay may enable the digital communication system 100 to operate with a higher clock signal frequency without a risk of data corruption.

However, in practice it has been found that even when digital communication systems use a clock signal with a fixed delay to compensate for anticipated propagation delay as described above, problems of data corruption at high clock frequencies may still be encountered.

Figure 2:
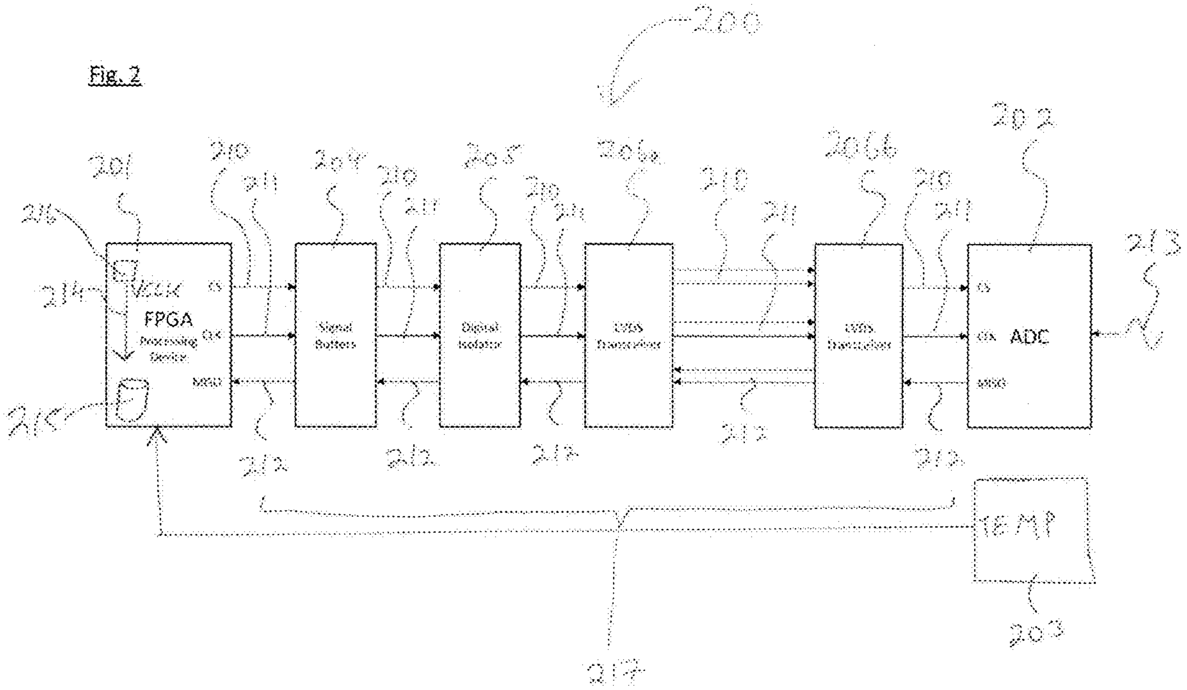
FIG. 2 shows a schematic diagram of a digital communication system according to an embodiment.

FIG. 2 shows a schematic diagram of a digital communication system 200 according to an embodiment. In the illustrated example of FIG. 2 the digital communication system 200 uses a Serial Peripheral Interface (SPI) digital communication protocol. However, this is not essential, and other digital communication protocols may be used instead of SPI.

In the illustrated embodiment of FIG. 2 the digital communication system 200 comprises a processing device 201 which is arranged to receive and process digital data from a remote device 202. The processing device 201 may be referred to as a main or master device and the remote device 202 may be referred to as a subsidiary or slave device. In the illustrated example the processing device 201 is a Field Programmable Gate Array (FPGA). However, this is not essential, and the processing device 201 may comprise other types of processing device. In the illustrated example the remote device 202 is an analog to digital converter (ADC). However, this is not essential, and is by way of example only. The remote device 202 may comprise any type of device which can produce digital data.

As shown in FIG. 2, the digital communication system 200 comprises a temperature sensor 203. The temperature sensor 203 is arranged to sense a temperature of the digital communication system 200 or an ambient temperature around the digital communication system 200, such as an ambient temperature in the vicinity of the digital communication system 200, and to send the sensed temperature value to the processing device 201. In the illustrated example, the digital communication system 200 is comprised in a missile and the temperature sensor 203 is arranged to sense an ambient temperature of the missile in the vicinity of the remote device 202.

As shown in FIG. 2, the digital communication system 200 further comprises one or more components arranged in a communications path 217 of the digital communications system 200 which provides a communicative connection between the processing device 201 and the remote device 202. In the illustrated embodiment, the one or more components comprise a signal buffer 204, a digital isolator 205, and a pair of first and second Low Voltage Differential Signaling (LVDS) transceivers 206*a* and 206*b*. The use of this specific combination of components is not essential, and different numbers, types and/or arrangements of components may be used in other examples. The present disclosure may be applied to any means for the transmission of a digital signal from a physically remote voltage sensor with respect to the location of the processing device.

In operation of the digital communication system 200, the processing device 201 generates a digital Chip Select (CS) signal 210 and a digital Clock (CLK) signal 211 and sends the CS signal 210 and the CLK signal 211 to the signal buffer 204. The processing device 201 also generates a variable delayed CLK (VCLK) signal 214 with a variable time delay compared to the original CLK signal 211, as will be discussed in more detail below.

The signal buffer 204 receives the CS signal 210 and the CLK signal 211, and then sends them on to the digital isolator 205. The signal buffer 204 adjusts and improves the CS signal 210 and the CLK signal 211 as required in any specific implementation, For example, the signal buffer 204 may be used to level-shift the voltage of the signals as required (i.e. from 3.3V to 5V or vice versa), and/or to increase the drive current of the signals, and/or to improve the signal integrity of the signals (for example, such as ensure the signal edges are 'clean'). The digital isolator 205 receives the CS signal 210 and the CLK signal 211, and then sends them on to a first LVDS transceiver 206*a*. The digital isolator 205 provides galvanic isolation between the processing device 201 and other parts of the digital communications system, such as the LVDS transceivers 206*a* and 206*b*, and the remote device 202.

The first LVDS transceiver 206*a* receives the CS signal 210 and the CLK signal 211 and then sends the CS signal 210 and the CLK signal 211 as differential voltages on respective pairs of conductive wires to the second LVDS transceiver 206*b*. The second LVDS transceiver 206*b* receives the CS signal 210 and the CLK signal 211 as differential voltages on the respective pairs of conductive wires and sends the CS signal 210 and the CLK signal 211 to the remote device 202. The use of LVDS to transmit signals between the first and second LVDS transceivers 206*a* and 206*b* may provide a low power consuming and low noise method of transmitting the signals which is resistant to electrical interference. The use of LVDS may be advantageous if the processing device 201 and the remote device 202 are a long distance apart.

In response to the received CS signal 210, the remote device 202 generates a digital data Main In Sub Out (MISO) signal 212 with a timing based on the received CLK signal 211. Generally, at the remote device 202 the generation of each bit of the MISO signal 212 is triggered by the reception of a specific predetermined part of the CLK signal 211, such as a rising or falling edge of the CLK signal 211. In the illustrated embodiment of FIG. 2 the triggering is on the falling edge of each digital clock signal.

Figure 3:
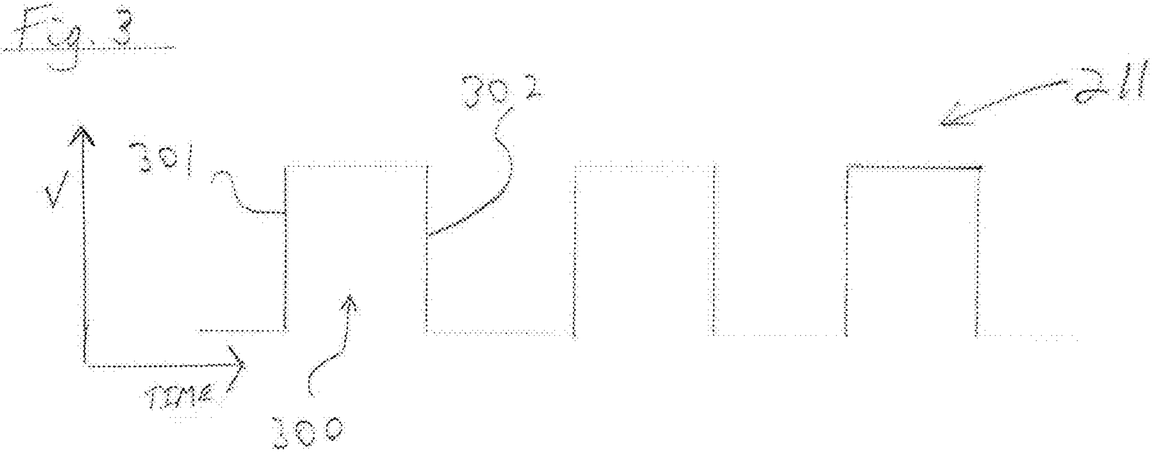
FIG. 3 is a schematic diagram of a clock signal useable in the digital communication system of FIG. 2.

FIG. 3 shows an example of a digital CLK signal 211 comprising a series of clock pulses 300 over time, each clock pulse 300 having a respective rising edge 301 and falling edge 302.

In the illustrated embodiment of FIG. 2 the remote device 202 is an ADC which uses the received CS signal 210 to initiate the analog to digital conversion of an analog signal 213 into digital values, and uses the received CLK signal 211 to prompt or trigger the generation of each bit of a current digital value as digital data. The remote device 202 then outputs the generated bits as digital data carried by the MISO signal 212. Accordingly, the timing of the sent bits of the MISO signal 212 is based on the timing of the received CLK signal 211 received at the remote device 202.

The remote device 202 sends the MISO signal 212 to the second LVDS transceiver 206*b*. The second LVDS transceiver 206*b* receives the MISO signal 212 and then sends the MISO signal 212 as differential voltages on a respective pair of conductive wires to the first LVDS transceiver 206*a*. The first LVDS transceiver 206*a* receives the MISO signal 212 as differential voltages on the respective pair of conductive wires, and sends the MISO signal 212 to the digital isolator 205.

The digital isolator 205 receives the MISO signal 212, and then sends it on to the signal buffer 204. The signal buffer 204 receives the MISO signal 212, and then sends it on to the processing device 201.

The processing device 201 receives the sensed temperature value from the temperature sensor 203 and uses the received temperature value to derive a corresponding latency compensation index value. In the illustrated embodiment of FIG. 2 the processing device 201 comprises a data store 215. The data store 215 stores a look up table comprising a plurality of different temperature values each stored in association with a latency compensation index value corresponding to the temperature value, and the processing device 201 derives the latency compensation index value by taking the latency compensation index value corresponding to the received temperature value stored in the look up table. The look up table may associate each latency compensation value with a respective range or "bucket" of temperature values.

As mentioned above, the processing device 201 generates a variable delayed CLK (VCLK) signal 214 with a variable time delay compared to the original CLK signal 211. The processing device 201 generates the VCLK signal 214 with a variable time delay set to be the same as the current derived latency compensation index value derived from the current received temperature value. Accordingly, as the temperature value sensed by the temperature sensor 203 varies the delay of the VCLK signal 214 relative to the original CLK signal 211 will vary. In the illustrated embodiment of FIG. 2 the processing device 201 generates the VCLK signal 214 by passing the CLK signal 211 through a variable delay device 216 having a variable delay time set based on the current derived latency compensation index value. In some examples the variable delay device 216 may be a shift register with a variable number of registers that are instigated as a function of the latency compensation index value, and thus of the sensed temperature. In other examples the variable delay device 216 may be a state machine that incorporates a variable counter function to set the delay of the VCLK signal by a counter termination value which changes based on the latency compensation index value, and thus the temperature.

The processing device 201 then samples or latches (also referred to as capturing) the digital values of the MISO signal 212 using the VCLK signal 214 to obtain the digital data from the remote device 202 with values corresponding to the timing of the CLK signal 211. In the illustrated embodiment of FIG. 2 the digital data obtained by the processing device 201 is bit values making up digital values corresponding to the values of the analog signal 213.

As discussed above, it will be understood that in practice the various components in the signal path between the processing device 201 and the remote device 202 (in the illustrated embodiment of FIG. 2 the signal buffer 204, digital isolator 205, and pair of first and second LVDS transceivers 206*a* and 206*b*) will introduce signal propagation delays or latency in the digital signals passing between the processing device 201 and the remote device 202 through the various components 204 to 206*b*, and in particular will introduce a signal propagation delay in the CLK signal 211 sent from the processing device 201 to the remote device 202 and in the MISO signal 212 sent from the remote device 202 to the processing device 201, in addition to internal delays within the remote device 202, so that the MISO signal 212 received at the processing device 201 will be delayed in time compared to the original CLK signal 211 which triggered the generation of the MISO signal 212 by a total, or "round trip", signal propagation delay which is the sum of the signal propagation delays in each direction. Typically, the delay or latency produced by each component in the signal path may be in the order of 10 s of nanoseconds per device.

It has been realized by the present applicant that the signal propagation delays of the different components arranged in the communications path between the processing device 201 and the remote device 202, and thus the total signal propagation delay, will usually be temperature dependent, so that they vary with temperature. For example, a digital isolator having a signal propagation delay of 35 ns at a temperature of −40 °C may have a signal propagation delay of 45 ns at a temperature of 125 °C, a variability of 10 ns over this temperature range. In digital communications systems having multiple components arranged in the communications path, such as the digital communications system 200 shown in FIG. 2, there may be similar, or larger, temperature dependent variation in signal propagation delay for each of the multiple components, so that the temperature dependent variation in the total signal propagation delay (generally corresponding to the sum of twice the temperature dependent variation of each of the components) may be relatively large. Without wishing to be bound by theory, it is expected that because of the nature of the underlying physical phenomena causing signal propagation delay to vary with temperature the variation will usually be positive (That is, the signal propagation delay will usually increase with increasing temperature and decrease with decreasing temperature). Accordingly, it is expected that the total variation in signal propagation delay will increase for more complex systems with more components as the individual variations of the different components sum together. It is expected to be unlikely in practice that a system will comprise components with a negative temperature variation and components with a positive temperature variation so that the temperature variation of the different components tends to counteract one another or balance out.

Although the range −40 °C to 125 °C is a relatively large temperature range there are many applications where digital communications systems may be exposed to changes in ambient temperature across this range or similar ranges. A requirement that electronics hardware must operate reliably across a temperature range of at least −40 °C to 125 °C is common in aerospace and military applications. For example, weapons carried on aerial vehicles, such as air-launched missiles, may be exposed to ambient temperatures of −40 °C or below in flight before launch, and then be subject to ambient temperatures of 125 °C or above after launch, for example due to aerodynamic frictional heating.

As a result of the variation in propagation delays with temperature, changes in the temperature of a digital communication system using a delayed clock signal with a fixed time delay in the processing device could suffer from the problem of the latching or sampling of the received MISO signal by the processing device being corrupted due to the MISO signal being sampled at, or after, the time boundary between the correct pulse of the clock signal and the subsequent pulse as a result of temperature induced changes in the propagation delays. This may lead to the problem that the digital data obtained by the processing device from the MISO signal is invalid and/or corrupted. It will be understood that this data corruption is more likely to occur at higher clock signal frequencies where the time duration of each clock signal pulse is shorter so that a smaller temperature induced change in propagation delay will cause data corruption. Accordingly, the variation in propagation delay with temperature may also result in the problem that there is a maximum clock signal frequency which can be used without a risk of data corruption. This maximum clock signal frequency may limit the accuracy and/or data transfer rate of a digital communication system between a remote data source and a processing device.

In order to compensate for the phenomenon of temperature dependent changes in the total propagation delay, the processing device 201 uses the VCLK signal 214 having a temperature dependent variable delay to sample or latch the digital values of the received MISO signal 212, rather than the original CLK signal 211 or a clock signal having a fixed delay relative to the CLK signal 211. Accordingly, the digital communication system 200 may be able to avoid the problems of data corruption discussed above and may be able to operate at a higher clock frequency than would otherwise be possible, enabling improved fidelity and accuracy, and/or a higher data transfer rate to be achieved.

In any specific implementation of the digital communication system 200 the total propagation delay at different temperatures can be determined in advance and appropriate latency compensation index values stored in the look up table in the data store 215 in association with the temperature values. The determination of the total propagation delay at different temperatures may be carried out in any convenient manner. In some examples, the determination may be carried out by subjecting the digital communication system 200 to a range of different temperatures while the total propagation delay is measured at the different temperatures. Conveniently, this may be done for a prototype or test version of the digital communication system 200 and the resulting latency compensation index values used for other identical digital communication systems 200. In other examples, the determination may be carried out by calculation from known or measured propagation delays at different temperatures of the various components of the digital communication system 200.

The components in the signal path between the processing device 201 and the remote device 202 of the digital communication system 200 of the illustrated embodiment of FIG. 2 are examples only. Propagation delay can be compensated for in a similar manner if alternative components and/or alternative number or arrangement of components are located in the signal path instead of the illustrated components. The digital communication system 200 may comprise any number (one or more than one) of components of any type or types in the signal path.

Figure 4:
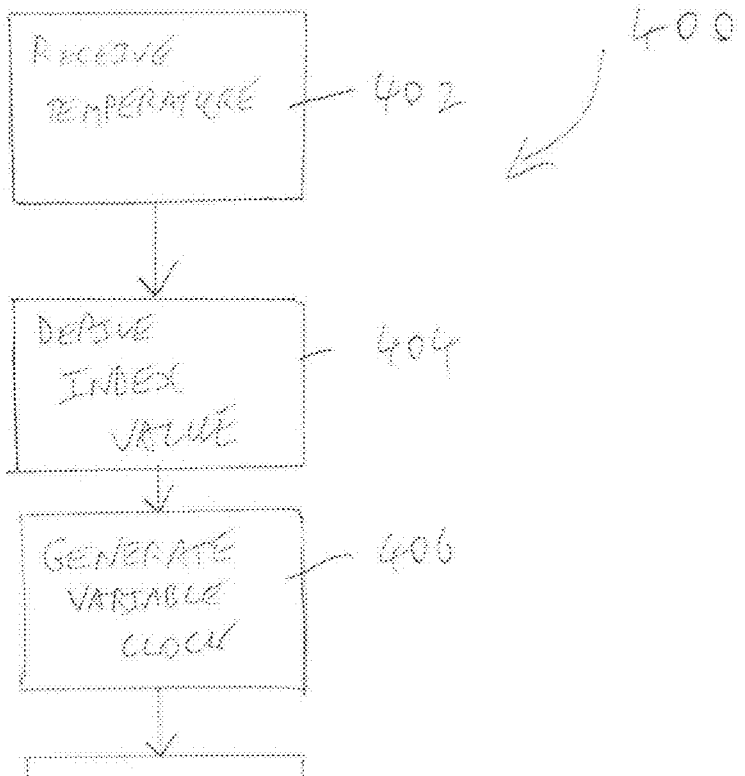
FIG. 4 shows a method of operation useable in in the digital communication system of FIG. 2.

FIG. 4 shows a method 400 usable by the processing device 201 of the digital communication system 200 of the illustrated embodiment of FIG. 2 to generate a variable clock (VCLK) signal in operation.

As shown in FIG. 4, in a first, receive temperature block 402, the processing device 201 receives a temperature value from the temperature sensor 203 corresponding to the temperature sensed by the temperature sensor 203. Then, in an derive index value block 404, the processing device 201 derives a latency compensation index value from the received temperature value. In the illustrated embodiment the latency compensation index value is derived using a look up table, as is described above. However, different methods of deriving this value may be used in other examples. Then, in a generate variable clock block 406, the processing device 201 generates a variable clock (VCLK) signal 214 based on the clock (CLK) signal 211 with a delay corresponding to the derived latency compensation index value. Finally, in a sample data block 408, the processing device 201 uses the VCLK signal 214 to latch or sample data received from the remote device 202, as is explained above.

In the illustrated embodiment the digital communication system 200 comprises a single temperature sensor 203. In many implementations, the temperatures of the different components arranged in the signal path of the system may be the same as, or substantially the same as, the temperature sensed by a single temperature sensor, so that the single sensed temperature value can be used to derive the latency compensation index value with sufficient accuracy. Further, in some implementations, the temperature of the different components, although not the same, may be related to the temperature sensed by a single temperature sensor in sufficiently predictable manner that a single sensed temperature value can be used to derive the latency compensation index value with sufficient accuracy.

In alternative examples the digital communication system may comprise multiple temperature sensors and may derive a latency compensation index value from multiple temperature values sensed by respective ones of the multiple temperature sensors. This may be advantageous in implementations where the differences between the temperatures of the different components arranged in the signal path of the system may be large enough that the latency compensation index value cannot be derived with sufficient accuracy from a single sensed temperature value. Accordingly, in such implementations, the temperature value sensed by each of multiple temperature sensors may be used to derive a separate latency compensation index value for a respective different component or group of components, and the resulting separate latency compensation index values combined, for example by summing, to produce a total latency compensation index value for the digital communication system as a whole.

Optionally, the processing device 201 may further generate a Main Out Sub In (MOSI) signal and send the MOSI signal through the signal path 217 to the remote device 202. The remote device 202 may then use the received CS signal 210, MOSI signal and CLK signal 211 to generate the MISO signal 212, with the timing of the MISO signal 212 being based on the timing of the received CLK signal 211.

In the illustrated embodiment, the processing device 201 comprises the data store 215 and the variable delay device 216. This is not essential. In alternative examples, either or both of the data store 215 and the variable delay device 216 may be external devices separate from the processing device 201.

In the illustrated embodiment, the processing device 201 uses a look up table to derive latency compensation index values from temperature values. This is not essential. In alternative examples, different means for deriving latency compensation index values from temperature values may be used. Any suitable method of derivation may be used.

The embodiments described above are fully automatic. In some alternative examples a user or operator of the system may manually instruct some steps of the method to be carried out.

The acts described herein may comprise computer-executable instructions that can be implemented by one or more processors and/or stored on a computer-readable medium or media. The computer-executable instructions can include routines, sub-routines, programs, threads of execution, and/or the like. Still further, results of acts of the methods can be stored in a computer-readable medium, displayed on a display device, and/or the like.

The methods described herein may be performed by software in machine readable form on a tangible storage medium e.g. in the form of a computer program comprising computer program code means adapted to perform all the steps of any of the methods described herein when the program is run on a computer and where the computer program may be embodied on a computer readable medium. Examples of tangible (or non-transitory) storage media include disks, thumb drives, memory cards etc. and do not include propagated signals. The software can be suitable for execution on a parallel processor or a serial processor such that the method steps may be carried out in any suitable order, or simultaneously. This application acknowledges that firmware and software can be valuable, separately tradable commodities. It is intended to encompass software, which runs on or controls “dumb” or standard hardware, to carry out the desired functions. It is also intended to encompass software which “describes” or defines the configuration of hardware, such as HDL (hardware description language) software, as is issued for designing silicon chips, or for configuring universal programmable chips, to carry out desired functions.

Various functions described herein can be implemented in hardware, software, or any combination thereof. If implemented in software, the functions can be stored on or transmitted over as one or more instructions or code on a computer-readable medium. Computer-readable media may include, for example, computer-readable storage media. Computer-readable storage media may include volatile or non-volatile, removable or non-removable media implemented in any method or technology for storage of information such as computer readable instructions, data structures, program modules or other data. A computer-readable storage media can be any available storage media that may be accessed by a computer. By way of example, and not limitation, such computer-readable storage media may comprise RAM, ROM, EEPROM, flash memory or other memory devices, CD-ROM or other optical disc storage, magnetic disc storage or other magnetic storage devices, or any other medium that can be used to carry or store desired program code in the form of instructions or data structures and that can be accessed by a computer. Disc and disk, as used herein, include compact disc (CD), laser disc, optical disc, digital versatile disc (DVD), floppy disk, and Blu-ray (RTM) disc (BD). Further, a propagated signal is not included within the scope of computer-readable storage media. Computer-readable media also includes communication media including any medium that facilitates transfer of a computer program from one place to another. A connection, for instance, can be a communication medium. For example, if the software is transmitted from a website, server, or other remote source using a coaxial cable, fiber optic cable, twisted pair, DSL, or wireless technologies such as infrared, radio, and microwave are included in the definition of communication medium. Combinations of the above should also be included within the scope of computer-readable media.

Alternatively, or in addition, the functionality described herein can be performed, at least in part, by one or more hardware logic components. For example, and without limitation, hardware logic components that can be used may include Field-programmable Gate Arrays (FPGAs), Program-specific Integrated Circuits (ASICs), Program-specific Standard Products (ASSPs), System-on-a-chip systems (SOCs). Complex Programmable Logic Devices (CPLDs), etc.

It will be understood that the benefits and advantages described above may relate to one embodiment or may relate to several embodiments. The embodiments are not limited to those that solve any or all of the stated problems or those that have any or all of the stated benefits and advantages. Variants should be considered to be included into the scope of the invention.

Any reference to 'an' item refers to one or more of those items. The term 'comprising' is used herein to mean including the method steps or elements identified, but that such steps or elements do not comprise an exclusive list and a method or apparatus may contain additional steps or elements.

Further, to the extent that the term "includes" is used in either the detailed description or the claims, such term is intended to be inclusive in a manner similar to the term "comprising" as "comprising" is interpreted when employed as a transitional word in a claim.

The order of the steps of the methods described herein is exemplary, but the steps may be carried out in any suitable order, or simultaneously where appropriate. Additionally, steps may be added or substituted in, or individual steps may be deleted from any of the methods without departing from the scope of the subject matter described herein. Aspects of any of the examples described above may be combined with aspects of any of the other examples described to form further examples without losing the effect sought.

It will be understood that the above description of a preferred embodiment is given by way of example only and that various modifications may be made by those skilled in the art. What has been described above includes examples of one or more embodiments. It is, of course, not possible to describe every conceivable modification and alteration of the above devices or methods for purposes of describing the aforementioned aspects, but one of ordinary skill in the art can recognize that many further modifications and permutations of various aspects are possible. Accordingly, the described aspects are intended to embrace all such alterations, modifications, and variations that fall within the scope of the appended claims.

What is claimed is:

1. A digital communication system comprising:
a processing device;
a remote device;
a signal path comprising one or more components and configured to provide a communicative connection between the processing device and the remote device; and
at least one temperature sensor configured to sense a temperature and send a sensed temperature value to the processing device;
wherein:
the processing device is configured to generate a clock signal and send the clock signal through the signal path to the remote device;
the remote device is configured to generate a digital data signal with a timing based on the clock signal and send the digital data signal through the signal path to the processing device; and
the processing device is further configured to (i) derive a delay value from the sensed temperature value, the delay value corresponding to a temperature dependent variation in signal propagation delay along the signal path in both directions, (ii) obtain a variable clock signal having a variable delay relative to the clock signal, the variable delay corresponding to the delay value, and (iii) use the variable clock signal to sample the digital data signal.

2. The digital communication system of claim 1, wherein the digital communication system is configured to use a Serial Peripheral Interface (SPI) digital communication protocol.

3. The digital communication system of claim 2, wherein the digital data signal is a Main In Sub Out (MISO) signal.

4. The digital communication system of claim 2, wherein the processing device is further configured to generate a Chip Select (CS) signal and send the CS signal through the signal path to the remote device.

5. The digital communication system of claim 2, wherein the processing device is further configured to generate a Main Out Sub In (MOSI) signal and send the MOSI signal through the signal path to the remote device.

6. The digital communication system of claim 1, wherein the temperature sensor is configured to sense a temperature of the digital communication system or an ambient temperature around the digital communication system.

7. The digital communication system of claim 1, wherein the processing device is configured to derive the delay value from the sensed temperature value using a look up table.

8. The digital communication system of claim 7, wherein the look up table is comprised in the processing device.

9. The digital communication system of claim 1, wherein the processing device is configured to generate the variable clock signal by passing the clock signal through a variable delay device.

10. The digital communication system of claim 9, wherein the variable delay device is comprised in the processing device.

11. The digital communication system of claim 1, wherein the processing device is a Field Programmable Gate Array (FPGA).

12. The digital communication system of claim 1, wherein the remote device is an analog to digital converter.

13. A missile comprising:
a digital communication system comprising:
a processing device;
a remote device;
a signal path comprising one or more components and configured to provide a communicative connection between the processing device and the remote device; and
at least one temperature sensor configured to sense a temperature and send a sensed temperature value to the processing device;

wherein:

the processing device is configured to generate a clock signal and send the clock signal through the signal path to the remote device;

the remote device is configured to generate a digital data signal with a timing based on the clock signal and send the digital data signal through the signal path to the processing device; and the processing device is further configured to (i) derive a delay value from the sensed temperature value, the delay value corresponding to a temperature dependent variation in signal propagation delay along the signal path in both directions, (ii) obtain a variable clock signal having a variable delay relative to the clock signal, the variable delay corresponding to the delay value, and (iii) use the variable clock signal to sample the digital data signal.

14. A method of digital communication between a processing device and a remote device through a signal path comprising one or more components, the method comprising:

generating, using the processing device, a clock signal;

sending, using the processing device, the clock signal through the signal path to the remote device;

receiving, using the processing device, a temperature value;

generating, using the remote device, a digital data signal with a timing based on the clock signal;

sending, using the remote device, the digital data signal through the signal path to the processing device; and using the processing device, (i) deriving a delay value from the temperature value, the delay value corresponding to a temperature dependent variation in signal propagation delay along the signal path in both directions, (ii) obtaining a variable clock signal having a variable delay relative to the clock signal, the variable delay corresponding to the delay value, and (iii) using the variable clock signal to sample the digital data signal.

15. The method of claim 14, wherein the digital communication uses a Serial Peripheral Interface (SPI) digital communication protocol.

16. The method of claim 15, wherein the digital data signal is a Main In Sub Out (MISO) signal.

17. The method of claim 15, further comprising:

using the processing device, generating a Chip Select (CS) signal and sending the CS signal through the signal path to the remote device.

18. The method of claim 15, further comprising:

using the processing device, generating a Main Out Sub In (MOSI) signal and sending the MOSI signal through the signal path to the remote device.

19. The method of claim 15, wherein the delay value is derived from the temperature value using a look up table.

20. The method of claim 15, wherein the variable clock signal is generated by passing the clock signal through a variable delay device.

* * * * *